United States Patent
Lo et al.

(10) Patent No.: US 7,282,922 B2
(45) Date of Patent: Oct. 16, 2007

(54) WIRE NETWORK MAPPING METHOD AND APPARATUS USING IMPULSE RESPONSES

(75) Inventors: Chet Lo, Salt Lake City, UT (US); Cynthia Furse, Salt Lake City, UT (US)

(73) Assignee: University of Utah Research Foundation, Salt Lake City, UT (US)

(*) Notice: Subject to any disclaimer, the term of this patent is extended or adjusted under 35 U.S.C. 154(b) by 0 days.

(21) Appl. No.: 11/345,071

(22) Filed: Jan. 31, 2006

(65) Prior Publication Data

US 2006/0182269 A1    Aug. 17, 2006

Related U.S. Application Data

(60) Provisional application No. 60/648,836, filed on Jan. 31, 2005.

(51) Int. Cl.
*G01R 31/11* (2006.01)
(52) U.S. Cl. .................... 324/534; 324/533
(58) Field of Classification Search ........... 324/637, 324/638, 534, 533
See application file for complete search history.

(56) References Cited

U.S. PATENT DOCUMENTS 6,724,859 B1   4/2004   Galli
7,010,441 B2*  3/2006   Galli et al. ............ 702/66

OTHER PUBLICATIONS

Boets, Patrick "The Modelling Aspect of Transmission Line Networks" IEEE, 1992, 137-141.
Schafer, Ronald W. et al. "Constrained Iterative Restoration Algoithms" IEEE, 1981, vol. 69, No. 4, pp. 432-450.

* cited by examiner

*Primary Examiner*—Walter Benson
(74) *Attorney, Agent, or Firm*—Thorpe North & Western LLP

(57) ABSTRACT

A method and apparatus for mapping a wire network is disclosed. The method includes obtaining a reflectometry test signal of the wire network. An estimated network impulse response is estimated from the reflectometry response. A wire network model is then initialized, and iteratively improved by simulating an impulse response of the wire network model and adjusting the wire network model to reduce differences between the simulated impulse response and estimated network impulse response.

37 Claims, 8 Drawing Sheets

WIRE NETWORK MAPPING METHOD AND APPARATUS USING IMPULSE RESPONSES

This application claims the benefit of U.S. application Ser. No. 60/648,836 filed on Jan. 31, 2005, entitled "Wire Network Mapping Method and Apparatus Using Impulse Responses," which is herein incorporated by reference.

BACKGROUND OF THE INVENTION

1. Field of the Invention

The present invention relates generally to the field of electronic testing. More particularly, the present invention relates to devices and methods for mapping signal paths in electronic systems

2. Related Art

Electronic systems are ubiquitous. An essential component of these systems is their internal signal paths, most typically provided by wired interconnects. Failures in the wiring frequently result in failure of the system. For example, aging wiring in buildings, aircraft and transportation systems, consumer products, industrial machinery, etc. is among the most significant potential causes of catastrophic failure and maintenance cost in these structures. High profile airline crashes attributed to aging wiring have brought the need for improved wire testing systems to the forefront of industry attention.

Efforts to develop techniques for the characterization and fault detection of electronic signal paths have been underway for years, with many successes. For example, techniques such as time domain reflectometry (TDR), frequency domain reflectometry (FDR), and sequence time domain reflectometry (STDR) can be used to determine where a short or break in a wire has occurred. More recently, improvements such as spread spectrum time domain reflectometry (SSTDR) and noise domain reflectometry (NDR) have been developed to allow testing of a wire while operational signals are present.

A test instrument using these reflectometry techniques generally injects a reflectometry test signal into the wire to be tested. As the test signal propagates from the test instrument, impedance mismatches in the wire generate reflections that propagate back to the test instrument. Impedance mismatches can be caused by a variety of things, including for example, breaks in the wire, short circuits, branches, and wire gauge changes. These results are then measured either directly or indirectly, providing a reflectometry response of the wire under test. For example, in a TDR, the test signal is a fast rise time pulse, and the reflections of the pulse are observed on a display such as an oscilloscope. For a FDR, the test signal is a sine wave, and the frequency of the sine wave is swept or stepped in frequency to permit measuring the phase delay and associating this with corresponding mismatches. NDR operates slightly differently, as no test signal is injected. In NDR, an existing signal present on the wire is used as the test signal, and the reflections of the existing signal observed.

Interpreting the results obtained with a reflectometry instrument for anything other than simple wires typically requires great expertise, as the reflectometry response can be very complex. For example, mismatches can generate reflections to both a forward traveling signal (e.g., the test signal injected by the test instrument) and a reverse traveling signal (e.g., a reflection generated by a mismatch further down the line). Mismatches also affect the signal passing past the mismatch. For example, a pair of mismatches can result in an infinite, although decaying, train of reflections as a portion of the test signal bounces back and forth. In general, the resulting reflected and re-reflected signals within a network superimpose on each other to create a complex overall response.

For single wires, significant progress has been made in allowing automated interpretation of the reflectometry response, allowing useful information, for example, wire length, to be determined by the instrument and displayed to a user in an easily usable format. For example, distance to a mismatch can be determined by observing the delay between the injected test signal and the reflected signal.

Many electronic systems, however, use wiring that is interconnected into a branched network. Testing of networks of wires has proven challenging. This is because branches in the network add a further level of complexity to the reflectometry response. Junctions of wires create an impedance mismatch that can be difficult to distinguish from other types of impedance mismatch. Reflections from different branches of a network can be re-reflected by other branches, and overlap in time. The superposition of multiple reflections from different branches and branch ends can cancel each other out, reinforce, or otherwise combine so as to create erroneous distance measurements when simple analysis algorithms are used. The number of reflections also tends to grow exponentially with the number of branches in the network; hence, complex network topologies produce extremely complex reflectometry responses. As a result, even if a distance measurement to a fault can be obtained, the result may be ambiguous, since which branch the fault is located on is not provided. Analyzing networks of unknown topology can therefore be particularly difficult.

SUMMARY OF THE INVENTION

It has been recognized that it would be advantageous to develop a technique for mapping an unknown or partially unknown network topology.

One embodiment of the invention is a method for mapping a wire network. A reflectometry response is obtained from the wire network, and an estimated impulse response is estimated from the reflectometry response. A wire network model is initialized and iteratively improved by simulating the impulse response of the wire network model and then adjusting the wire network model to reduce the differences between the hypothesized network topology and estimated impulse response.

Additional features and advantages of the invention will be apparent from the detailed description which follows, taken in conjunction with the accompanying drawings, which together illustrate, by way of example, features of the invention.

DETAILED DESCRIPTION

Figure 1:
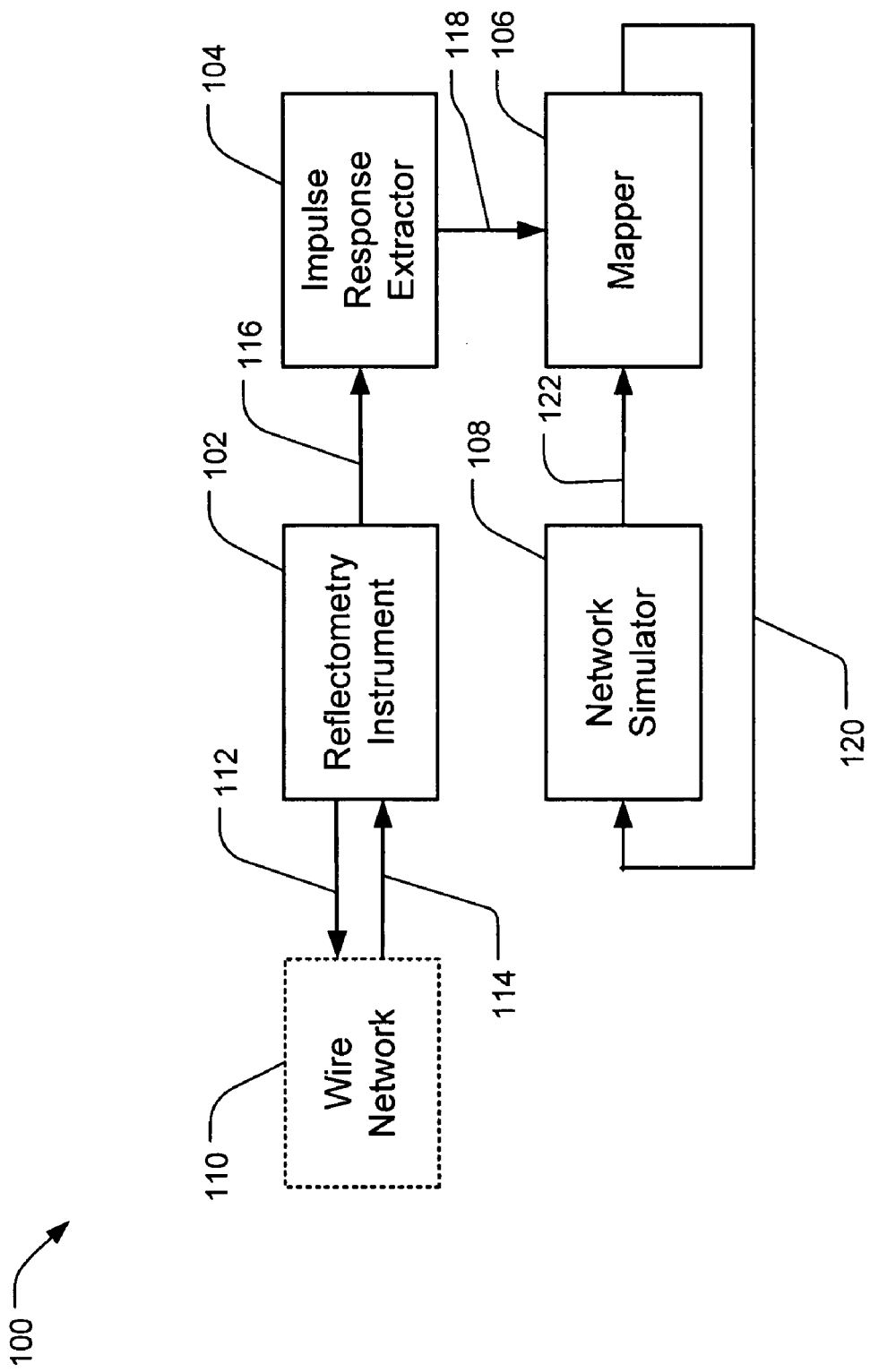
FIG. 1 is block diagram of an apparatus for mapping a wire network in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Throughout this application the term wire network is used to refer in a general sense to a network of signal conductors. Although signal conductors are most typically wires—including for example bare or insulated wires, twisted pairs, and coaxial cables—signal conductors may be in the form of printed circuit board traces, waveguides, piece of rebar in a concrete structure, or even wireless channels. Hence, it is to be understood that the inventive concepts disclosed within may be directly applied to a variety of networks that can carry electromagnetic signals.

As illustrated in FIG. 1, an apparatus 100 for mapping a wire network is shown in accordance with an embodiment of the present invention. The apparatus may be used to map a wire network 110 having an unknown, or partially unknown, topology. The apparatus includes a reflectometry instrument 102, which is configured to obtain a reflectometry response 118 of the wire network. The reflectometry response is provided to an impulse response extractor 104. The impulse response extractor is configured to estimate an estimated network impulse response 118 from the reflectometry response. The estimated network impulse response is provided to a mapper 106, which iteratively improves a wire network model 120.

The wire network model 120 can be output from or displayed by the apparatus 100, and provides an estimate of the topology of the wire network 110. This topology may include descriptions of wire arrangements, wire lengths, wire impedances, and wire terminations. The hypothesized network is obtained iteratively by the mapper 106 as follows. A network simulator 108 simulates the input of an impulse into the hypothesized network and extracts a simulated impulse response 122, which is provided to the mapper. The mapper compares the simulated impulse response to the estimated network impulse response 118, and revises the wire network model to reduce the differences.

Considering first the reflectometry instrument 102, various different instruments can be used for obtaining a reflectometry response of the wire network. For example, a TDR, FDR, STDR, or SSTDR can be used to inject a test signal 112 into the wire network, obtain the network response 114, and output a reflectometry response 116. Various different TDR, FDR, and STDR systems are known in the art which can be used with embodiments of the present invention. Commonly-owned co-pending U.S. patent application Ser. No. 11/241,757, entitled "Apparatus and Method for Testing a Signal Path from an Injection Point," herein incorporated by reference, describes a different type of reflectometer known as a mixed signal reflectometer (MSR) which can also be used with embodiments of the present invention. Commonly-owned co-pending U.S. patent application Ser. No. 11/198,900, entitled "Method and Apparatus for Characterizing a Signal Path Carrying an Operational Signal" provides an example of an SSTDR system, herein incorporated by reference.

An alternate approach to obtaining a reflectometry response of the wire network is a so-called noise domain reflectometry (NDR) which uses existing signals present within the wire network to obtain the network response. An NDR is disclosed in commonly-owned co-pending U.S. patent application Ser. No. 11/231,520, entitled "Method and System for Testing a Signal Path Having an Operational Signal," herein incorporated by reference. STDR, SSTDR and NDR can used while the network is carrying an operational signal, providing additional benefits for testing and mapping of a network, since a system using the network need not be shut down during testing. NDR has the particular benefit that it uses an existing operational signal present in the wire network and therefore does not need to inject an additional signal.

The form of the measured reflectometry response varies, depending on the type of instrument. For example, a TDR injects a fast rise time pulse, an FDR injects a swept-frequency or stepped-frequency sine wave, a STDR injects a pseudorandom sequence, and a SSTDR injects a spread spectrum signal (for example, a pseudorandom sequence which is sine wave modulated). Accordingly, the measured reflectometry response may be a time domain response or frequency domain response of the wire network to the injected reflectometry test signal. For example, with TDR, steps in the time domain response are proportional to the reflection coefficient of the impedance mismatch at delays proportional to the distance between the point of signal injection and the impedance mismatch. Other reflectometry instruments, perhaps even not yet developed, may also be used. Although their input signals will be different than the ones described above, and the shape of the measured data different as well, a new reflectometry instrument which produces a signature from which the impulse response may be extracted can be used. The ability to use different reflectometry instrument types in embodiments of the present invention provides an advantage in that different instrument types often have different strengths and weaknesses. Hence, in some environments, use of one particular instrument type may be more desirable.

The impulse response extractor 104 estimates an estimated network impulse response 118 from the reflectometry response 116. Depending on the type of reflectometry instrument 102 used, the operation of the impulse response extractor 104 may vary. For example, for a voltage step as used by a TDR, the impulse response may be estimated by differentiating the reflectometry response in the time domain. Of course, some noise is often present in the reflectometry response, and hence improved performance can be obtained using various known algorithms for estimating the derivative of a measured or sampled sequence. For FDR, the reflectometry response is provided as a phase change as a function of the input frequencies. The Fourier transform of this phase vs. frequency function gives a peak whose magnitude corresponds to the magnitude of the reflected signal, and whose distance from the original corresponds to the location of the impedance discontinuity. The impulse response can be found several ways, including applying a simple peak detection algorithm to the Fourier transform of the phase vs. frequency function, or using a matched filter on this same function. Alternately, the FDR reflectometry response can be viewed as the frequency domain version of the impulse response and the time domain response may be obtained by inverse Fourier transforming the frequency domain response to obtain a time domain response. Various ways of estimating the inverse Fourier transform are known in the art. For SSTDR, the reflectometry response can be provided in the form of a correlation function, which may be converted into the impulse response via peak estimation. Various other approaches for obtaining the estimated impulse response are possible as will be discussed below.

In general, the impulse response of a wire network 110 is a theoretical function, corresponding to the response that is observed from the wire network if a test impulse is injected into the wire network. The impulse response is a series of impulses at various time delays. Each impulse in the impulse responds to a reflection of the test impulse created by one or more mismatches. The magnitude of the impulse will correspond to the degree of mismatch causing the reflection (modified by attenuation caused by propagation through other additional mismatches). The time delay of each impulse corresponds to the distance from the point of injection of a test impulse, to the impedance mismatch causing the reflection, to the point of measurement of the response. When the point of injection and point of measurement of the response are the same, the time delay is thus the round trip propagation delay to the mismatch.

It should be noted, however, that the impulse response of the wire network 110 may not be purely composed of impulses. For example, filtering effects can cause the reflected impulses to be changed into various differing pulse shapes. Filtering can result from the inductance or capacitance of the wires used in the network. More significantly, the presence of reactive components (e.g., capacitors and inductors) within the network can cause large filtering effects. Filtering effects can optionally be taken into account in the impulse response extractor 104. For example, the impulse response extractor may determine the locations of peaks of the impulse response and ignore the filtering effects. In other words, the wire network may be treated as a set of ideal, non-filtering, wires and junctions, and the impulse response extracted accordingly. Alternately, the impulse response extractor may determine an estimated impulse response which includes filtering effects (and is thus a more complex function than a series of impulses). When the estimated impulse response does not include filtering effects, simulation of the wire network is simplified.

In practice, because an impulse is difficult to approximate, measurement of the response of the wire network 110 is performed using a test signal other than an impulse, for example, a step function as used in TDR. Accordingly, the reflectometry response 116 is the convolution of the (theoretical) impulse response of the wire network 110 with the reflectometry signal 112, measured in either time or frequency domain. Thus, it is possible for reflections that are close enough together in time to overlap.

The impulse response can thus be obtained by deconvolution of the time domain response. Various ways of performing deconvolution are known in the art, including for example iterative algorithms such as described by Ronal W. Schafer, et al., "Constrained Iterative Restoration Algorithms," published in *Proceedings of the IEEE*, Vol. 69, No. 4, pp. 432-450, April 1981. The impulse response extractor may be implemented in hardware, software which runs on a processor, or a combination of hardware and software as will occur to one skilled in the art. Accordingly, one embodiment of the present invention is a computer program product which includes computer readable program code to implement a wire network mapping algorithm as described within. The computer program product can be, for example, a floppy disk, compact disk, digital video disk, or other form of computer readable media as known in the art. As another example, the computer program product can be a data signal embodied in a carrier wave, for example, for software distributed through the Internet, through a dial-up bulletin board system, and the like.

Continuing the discussion of FIG. 1, the network simulator 108 and mapper 106 interact to iteratively improve the wire network model 120, so that the wire network model eventually, in most cases, converges to a close approximation of the wire network 110. The network simulator is configured to simulate the impulse response of the wire network model to form a simulated impulse response 122. This simulation can optionally include filtering effects. The mapper accepts the simulated impulse response from the network simulator and accepts the estimated network impulse response 118 from the impulse response extractor 104. In some cases, such as the first reflection observed, the mapper can make a good calculation of the impedance mismatch causing the reflection, and hence the most likely network configuration close to the signal injection point. The mapper revises the wire network model to reduce differences between the simulated impulse response and the estimated network impulse response For example, in one embodiment of the present invention, the mapper 106 may be implemented using software running on a processor. The mapper may begin by initializing a wire network model corresponding to the hypothesized network. An iteration loop may then improve the wire network model by repeatedly simulating the impulse response of the wire network model and adjusting the wire network model to reduce differences between the simulated impulse response and the estimated network impulse response.

More particularly, the wire network model 120 may include a plurality of hypothesized network topologies, for which a corresponding simulated impulse response is created for each hypothesized network topology to produce a plurality of simulated impulse responses. Network topologies that match the wire network 110 produce very similar simulated impulse responses to the estimated network impulse response for the portions over which they match. Since the wire network model is typically built starting at the point where the reflectometry test signal is injected, simulated responses generally match the estimated network impulse response at points early in time, deviating at points later in time depending on how different the hypothesized network topology is from the actual topology of the wire network. Note that multiple reflectometry responses, obtained from multiple test points, can also be used during this process to help narrow the number of hypotheses which must be carried during the iteration.

Each of the simulated impulse responses can be compared to the estimated network impulse response. Hypothesized network topologies that produce large differences can be discarded. For example, the network topologies can be rated by the time at which the first difference between the simulated impulse response and the estimated network impulse response occurs, and those with the longest times kept. Alternately, the differences can be measured at several different points and combined (e.g. summed), for example by weighting earlier differences more heavily, taking the absolute difference at each point, or squaring the difference at each point. Many weighting algorithms are possible, including, for example, time weighting the differences with a weighting function that decays exponentially, hyperbolically, geometrically, etc. when moving later in time in the responses. Weighting functions can also be a function of the magnitude of the responses, for example, giving higher weight to greater magnitude that tends to be more accurately measured. Those network topologies with differences that exceed a predefined limit can be discarded. Allowing some differences between the hypothesized and estimated network impulse responses can help to accommodate noise that may be present in the measurements. Hence, hypothesized network topologies which approximately match the estimated network impulse response, e.g. within a predefined difference, can be retained and the other hypothesized network topologies discarded. Optionally, a single hypothesis network topology whose corresponding simulated impulse response best matches the estimated impulse response can be retained and all other hypothesis discarded at each iteration. New hypothesis network topologies can be created from the one or more retained hypothesis topologies during each iteration as described further below.

Various ways of initializing the wire network model are possible. One approach to initialize the wire network model is based on initial portions of the estimated impulse response. For example, one or more initial impulses in the estimated impulse response may be used to develop hypothesized network topologies. More particularly, the first impulse in the impulse response corresponds to a first mismatch (e.g. junction) in the network and the second impulse corresponds to a second mismatch (e.g. junction) in the network. A third impulse may correspond to either a third junction or a reflection between the first and second mismatch, which can be determined based on the magnitude of the pulse. Hence, the first few features of the wire network model may be determined directly from the initial portions of the estimated impulse response. As another example, a lookup table can include a tabulation of various network topologies and their corresponding impulse response patterns which can be used to determine an initial wire network model.

As another, more detailed example, the multiple hypothesized network topologies can be created as follows. An initial wire network model may be defined to consist of an infinitely long wire of constant impedance. For convenience, a predefined value, such as 50 ohms may be selected, or an initial impedance value may be estimated based on an initial portion of the estimated network impulse response. Estimating an initial impedance value may be performed, because there may be a first reflection corresponding to mismatch between the reflectometry test instrument 102 and the first portion of the wire network 110.

Additional hypothesized network topologies can be created from the wire network model by hypothesizing a network feature at a location corresponding to a first difference between the estimated network impulse response and one of the multiple simulated impulse responses. For example, a network feature may include an open circuit, short circuit, a branch in the network, or a wire gauge (and thus impedance) change. For branches, the branched wires may be initialized as infinitely long wires of constant impedance, and a predetermined or initially estimated impedance value assigned. Multiple new network topologies can be created from the wire network model by combining the different hypothesized network features with copies of the wire network model.

For example, starting from an initial wire network model which corresponds to an infinitely long wire, a first (in time) difference between the simulated impulse response and estimated network impulse response will be observed. This difference may correspond to any one of a number of network features. Hence, new hypothesized network topologies can be created which correspond to a wire with a network feature at a location corresponding to the time delay of the first difference. One hypothesized network topology may correspond to a first hypothesis that an impedance change is present at that location. Another hypothesized network topology may correspond to a second hypothesis than a two-way branch is present at that location. Yet another hypothesized network topology may correspond to a third hypothesis that a three-way branch is present at that location. Each of these new hypothesis will be simulated, and may be rejected (because its simulated impulse response does not match the estimated network impulse response) or may give rise to additional hypothesized network topologies as additional network features are hypothesized to correspond to later (in time) differences between the simulated impulse responses and estimated network impulse response).

Of course, a large number of hypothesized networks can be created and simulated. Carrying large numbers of hypotheses in the iteration can allow improved accuracy in the results, but at the expense of increased memory storage and processing time requirements. Faster operation can be obtained by limiting the number of hypotheses maintained, and limiting the number of network features accommodated. For example, for many wire networks, junctions of greater than three connections are uncommon, hence the hypothesized network topologies may be limited so that branches greater than two are not hypothesized, limiting the number of hypothesized topologies that are created, simulated, and compared. Also, many networks are made up of multiple branches of the same type of wire, so the impedance of the branches can be assumed to be equal, in order to reduce computational complexity. As an alternative, wire types (and hence impedances) may be limited to several discrete values corresponding to known types used in the network. Of course, with increased computational complexity, these limitations can be relaxed.

One particular format for storing data on a network topology will now be described. A first field can hold an equipment code that represents the type of reflectometer used, for example 1 for TDR, 2 for STDR, 3 for SSTDR, etc. Then, a number of triplets representing each wire segment or termination may be included, where each triplet encodes the length, impedance, and number of branches at the end of the segment. Segment triplets are presented in order, from top to bottom and left to right in the network. Characteristics of the reflectometer can be included in segment zero. Termination impedances can be represented by a segment of length zero, having a branch number of zero.

Figure 2:
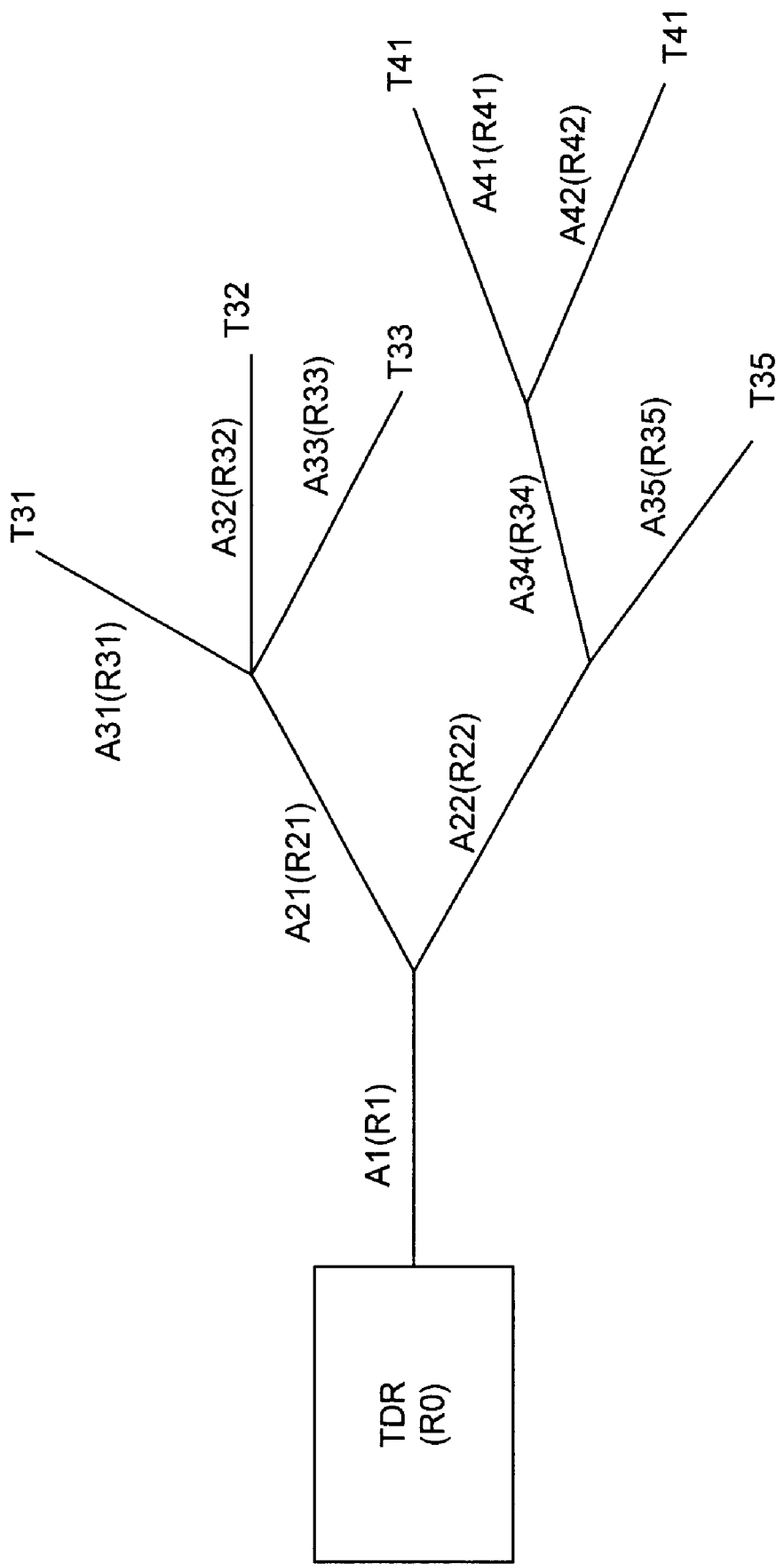
FIG. 2 is exemplary diagram of a wire network description in accordance with an embodiment of the present invention.

An illustration of an exemplary network, with segments of length A1, A21, A22, . . . A42 and corresponding impedances R1, R21, R22, . . . is shown in FIG. 2. The corresponding representation of this network is thus be given by:

1 0 R0 1 A1 R1 2 A21 R21 3 A22 R22 2 A31 R31 1 A32 R32 1 A33 R33 1 A34 R34 2 A35 R35 1 0 T31 0 0 T32 0 0 T33 0 A41 R41 1 A4 2 R42 1 0 T41 0 0 T42 0

The first digit {1} indicates a TDR instrument according to the encoding described above. The next triplet {0, R0, 1} corresponds to a zero length segment with impedance R0 (the impedance of the TDR instrument) with a single segment connected at the end. The next triplet {A1 R1 2} describes the segment of length A1 with impedance R1, and indicates there are two segments connected to the end. The next two triplets {A21 R21 3} and {A22 R22 2} describe the segments attached to the end of segment A1. The two segments have a total of 5 segments attached (3 at the end of A21 and 2 at the end of A22), and the next 5 triplets describe those segments. For segments ending in a termination, the triplet defines 1 additional segment attached, which at the next level of description is described as a zero length segment with the termination impedance and no further segments attached. For example, {0 T31 0} describes the termination attached to the end of segment A31.

This is but one example of a network representation; many other representations can be used in embodiments of the present invention as will occur to one skilled in the art, including for example, modifying the order of traversing the network, modifying the order of the elements in this data storage format, including less or additional data, and storing the data as a vector or matrix (e.g., adjacency matrix or edge vector) etc.

Figure 3:
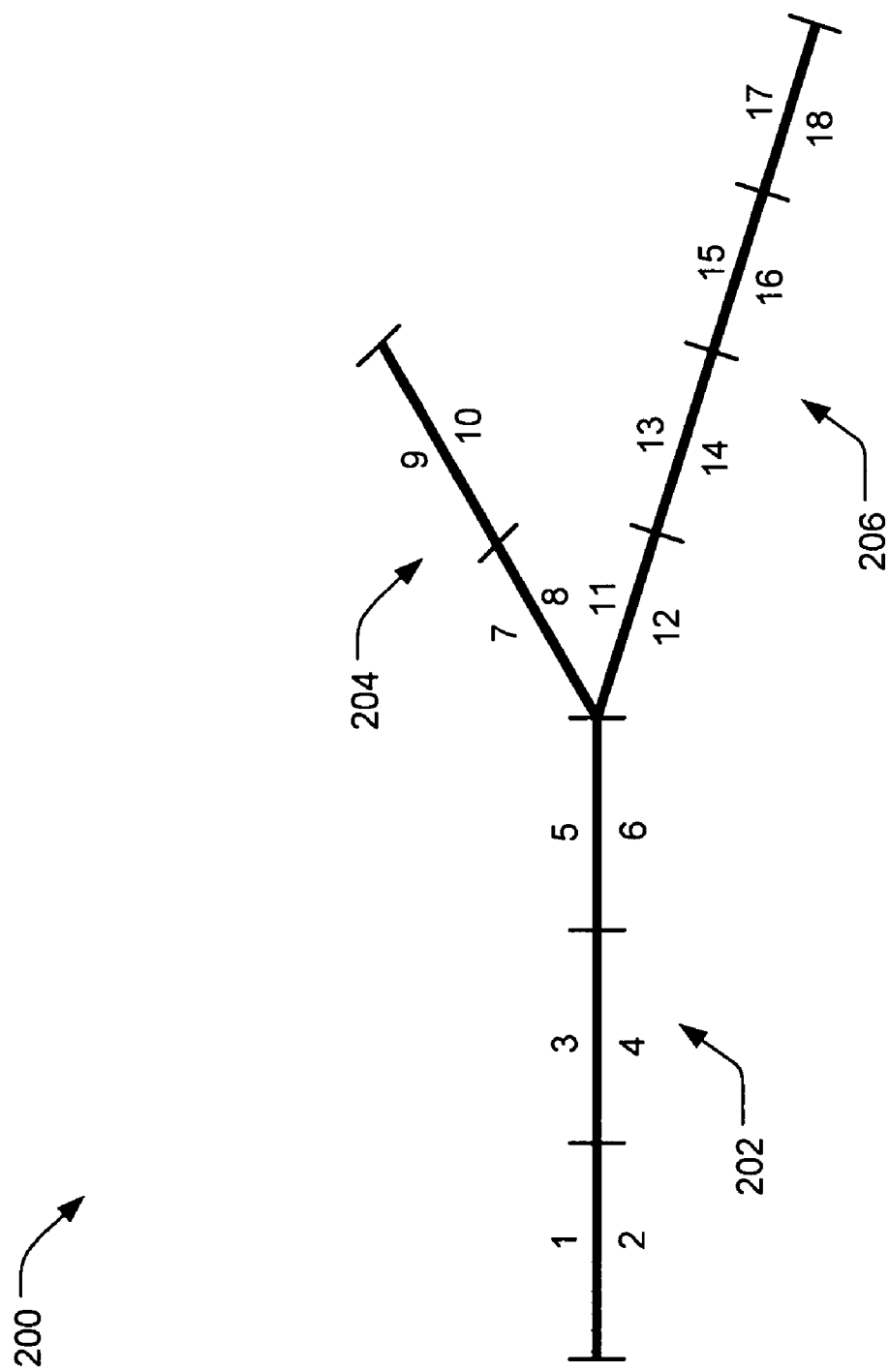
FIG. 3 is a diagram of a segmented network topology in accordance with an embodiment of the present invention.

Discussing the network simulator 108 in further detail, there are many different options for implementation of the network simulator. In one exemplary embodiment, the network simulator may simulate the impulse response of a network topology as follows. The network topology is described by a number of equal length segments. For example, FIG. 3 illustrates a network 200 having an initial portion 202 which is 3 units long and two branches 204, 206, two and four units long respectively. Each segment is numbered; the upper (odd) numbers correspond to the state of the segment for forward (left to right) traveling signals and the lower (even) numbers correspond to the state of the segment for reverse (right to left) traveling signals. A state vector, $x=\{x_1, x_2, \ldots x_{18}\}$, represents the signal state on the network, where each element of the state vector is the state of an individual segment as just described.

Figure 4:
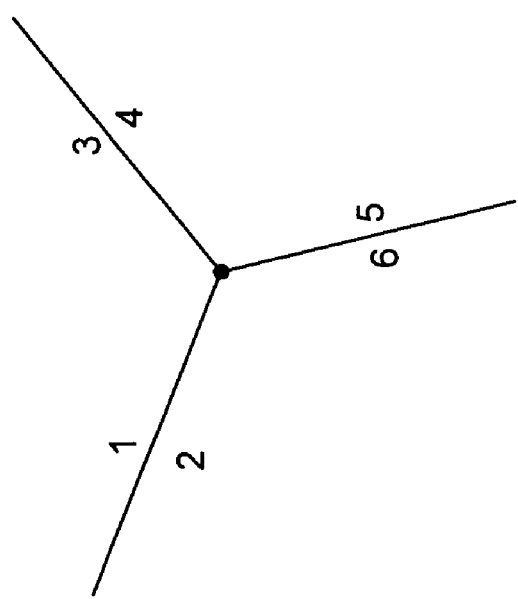
FIG. 4 is a diagram of a segmented network junction in accordance with an embodiment of the present invention.

A state transition matrix can thus be defined for the network where each element corresponds to the signal flow between a pair of segments of the hypothesized network topology. For example, a three way junction can have six different possible signal transitions, as the forward signal coming into the junction from each of the three branches can introduce signals onto each of the three branches. An exemplary three way junction is illustrated in FIG. 4, where the segment numbering follows the convention as shown above. Hence, the columns of the transition matrix represent the input segment and the rows represent the output segment. If all three wires have the same impedance, then the corresponding transition matrix is thus given by:

$$A = \begin{bmatrix} 0 & 0 & 0 & 0 & 0 & 0 \\ r & 0 & t & 0 & t & 0 \\ 0 & 0 & 0 & 0 & 0 & 0 \\ t & 0 & r & 0 & t & 0 \\ 0 & 0 & 0 & 0 & 0 & 0 \\ t & 0 & t & 0 & r & 0 \end{bmatrix}$$

where r is the reflection coefficient at the junction and t is the transmission coefficient at the junction, and thus r=−0.33 and t=0.66. It will be appreciated that the sum of the reflection and transmission coefficients for any node is one. Many of the entries in the transition matrix are zero, since there is no transition of signal between the relevant segments. Of course, if the three wires have different impedances, then the reflection and transmission coefficients are different for each of the transitions.

From the state vector $x_1$ (time 1) the state vector $x_2$ (time 2), can be found by matrix multiplication $$x_2 = A\, x_1.$$

Thus, an impulse response can be developed by starting with an initialized state vector, for example, by placing a unit voltage on segment 1, and then repeatedly multiplying the state vector by the state transition matrix. The output can then be extracted during this process, for example by storing samples of the voltage on segment 2. Of course, many of the entries is the matrix are zero, hence, the matrix multiplication may be performed efficiently using techniques known in the art for accommodating spare matrices.

Normally, the reflectometry response will be measured at the same point the reflectometry test signal is injected. It should be noted, however, that embodiments of the present invention may be readily adapted to handle situations where the reflectometry test signal is injected into a first point in the wire network, and the reflectometry response is measured at a second point. This is accommodated in simulating the impulse response by extracting the impulse response from a different segment. Furthermore, from the foregoing, it can be seen than multiple reflectometry measurements taken at different points in the wire network may be accommodated by estimating network impulse responses for each point and comparing the network impulse responses to simulated impulse responses taken from corresponding segments of the wire network model. Similarly, injection of reflectometry test signals into different points in the wire network can also be accommodated by changing the initialization of the state vector to correspond. Even the injection of multiple, simultaneous, reflectometry test signals can be accommodated. By combining network mapping results from different injection and/or extraction points, resolution of ambiguities can be enhanced.

Figure 5:
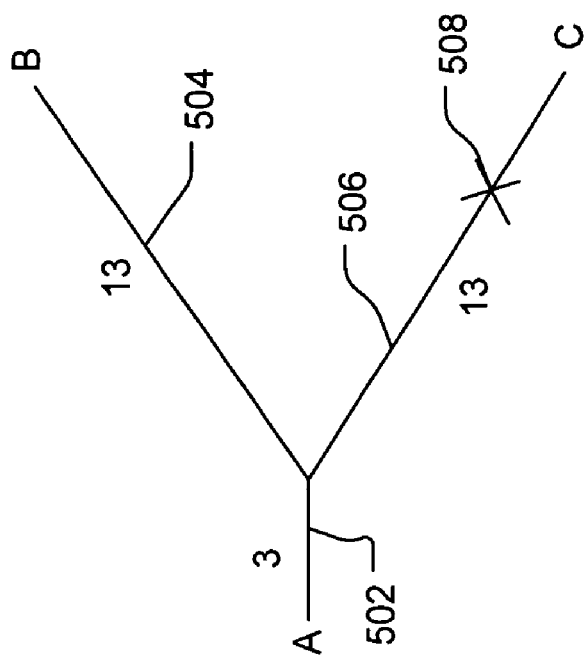
FIG. 5 is a diagram of an exemplary network in accordance with an embodiment of the present invention.

For example, FIG. 5 illustrates a network configuration having three connected wires 502, 504, 506. This network can be ambiguous, under some circumstances, when measured from the end of wire 502 at point A, since it is difficult to identify whether reflections are from wire 504 or 506. For example, consider the case where wire 506 is broken (e.g., an open circuit at point 508). The distance to the open circuit from point A can be identified, but which arm has the open circuit may be ambiguous. If reflections from the ends of wire 504 and 506 are distinctive, and it is known which reflection corresponds to which wire, this ambiguity can be resolved. Alternately, if the same network is measured from point B, the ambiguity can also be resolved; since the distance from point B to the open circuit is longer than the total length of wire 502 plus wire 504, the open circuit is on wire 506. Accordingly, improved network mapping can be obtained by obtaining reflectometry responses from more than one test point within the network, and combining these results.

For example, a reflectometry test signal can be injected into a first test point, and responses observed at several different second test points (e.g., injecting a test signal into point A and observing the response at A, B, and/or C). Alternately, a reflectometry test signal can be injected into several different first test points, and the responses observed at a second test point (e.g. injecting a test signal into point A, B, and/or C and observing the response at point A). As yet another example, the response can be measured by injecting test signals into several different first test points and observing the responses at several different second test points (e.g. injecting into A and observing the response at B, injecting into B and observing the response at C). These results can then be used to help to resolve ambiguities. For example, hypothesis network models can be constructed based on the results for a first test point, and then checked against results from a second test point. Note, the reflectometry response obtained at different points can be obtained sequentially (e.g., to help avoid interference between injected signals) or simultaneously (e.g., for SSTDR test signals can be selected to be non-interfering with each other).

From the foregoing it will also be appreciated that partially or completely known networks can also be accommodated. For example, if portions of the network are known, these can be held fixed in the wire network model, and hypothesized network models which are created can be limited to varying only unknown portions of the wire network model. Similarly, it will be apparent from the foregoing that detection of failures or changes in known networks can be accomplished by comparing the wire network model to previously stored information about the wire network topology.

As will be appreciated by one skilled in the art, the above network simulation embodiment performs well for networks without significant filtering effects. This technique can also be used for networks where the filtering effects are significant, but ignored or compensated for during extraction of the estimated impulse response. Other techniques for simulating the network can also be used. For example, the network can be simulated using finite difference time domain (FDTD) techniques. FDTD may provide more flexibility than the previously described technique, and can include extra elements of the network such as resistors, capacitors, inductors, and the like. Accordingly, FDTD can be used for networks with significant filtering effects, where the estimated impulse response of the wire network includes various pulse shapes. FDTD may, however, require more computational resources than the above described techniques.

A particularly detailed example of one embodiment of the present invention will now be presented to further illustrate the operation of the inventive techniques. A mapping method begins by assuming the wire network is a single wire with a very short length and a terminator that is impedance matched to the wire. In other words, the wire network model (network topology hypothesis) is set to a single wire with short length and impedance matched termination. This produces a zero impulse response for the simulated impulse response. This is compared with the estimated network impulse response (obtained from the measured reflectometry response), for example, by subtracting them, to determine the location and magnitude of the first (earliest time) difference.

Time or phase delay between the incident and reflected signals gives the distance to the mismatch. Hence, the location of the first difference in time (t) relates to the location of the mismatch in space (L). For example, the distance from the point of injection to the location of the mismatch can be found from $$L = \tfrac{1}{2} v_p t$$

where $v_p$ is the propagation velocity of the injected signal within the network. The factor of ½ accounts for the round-trip nature of the delay, since the injected signal travels down the network to the mismatch, is reflected, and then travels back down the network to the extraction point.

From the magnitude of this difference, what impedance mismatch is present in the network can be determined using the reflection coefficient equation (or, alternately, a lookup table):

$$\text{reflection coefficient} = \Gamma = (Z_i - Z_o)/(Z_i + Z_o),$$

where $|\Gamma|$ is the normalized height of the impulse, $Z_i$ is the impedance mismatch, and $Z_o$ is the impedance of the wire.

For example, a reflection coefficient of +1 indicates an open circuit or other high impedance ($Z_i$=infinity) and a reflection coefficient of $-1$ indicates a short or low impedance ($Z_i$=0). A junction of wires will have a value in between these extremes. For example, a junction branching into two wires (all wires having the same impedance ($Z_o$)), results in an impedance of $Z_i = Z_o/2$, resulting in a reflection coefficient of $-1/3$.

In general, for a junction of n branches of equal impedance, $Z_i = Z_o/n$, and the reflection coefficient is given by $$\Gamma = (Z_o/n - Z_o)/(Z_o/n + Z_o) = (1-n)/(1+n)$$

which can be solved to determine the number of branches. Of course, junctions with mixed impedances are more difficult to solve. Fortunately, many wire networks are limited in the types of wires and number of branches injunctions, helping to reduce the number of hypotheses which must be considered.

Returning to the discussion of the particularly detailed example, a new wire network model (one or more network topology hypotheses) is obtained by defined the wire network as a wire with length L, as determined above, branching into two n wires, as determined above, each additional wire terminated by a matched load ($Z_o$). The length of the additional wires does not matter, because any wire terminated with a matched impedance does not contain a reflected signal. For convenience, the length used can be selected to be "1".

The wire network model is then simulated to produce a simulated impulse response. The simulated impulse response is compared (for example, by subtraction) to the estimated network impulse response. Since the first impulse now shows up in both the measured and simulated impulse responses, it will be subtracted out (or in the case of other types of comparisons, otherwise ignored or eliminated).

The next impulse observed in the comparison will then be evaluated as above to find the length (L) and hence location of the next impedance mismatch. If a junction had been determined from above, this mismatch gives the length and termination of the shortest of the arms of the junction. At this point, it is not known which of the two arms is the shortest, so all possible options are kept. Hence, the wire network model may consist of multiple network topology hypotheses. Information on how well the simulated impulse response matches the estimated network impulse response, referred to as "error energy," may be kept for each network topology hypothesis.

The impulse response for all network topology hypotheses is simulated and compared to the estimated network impulse response. This gives the error energy for each network topology hypothesis and the location and magnitude of the next impulse in the corresponding next generation of network topology hypotheses. Each network topology hypotheses is then analyzed to determine all possible locations for a branch or impedance mismatch that would match the next impulse difference. For instance, this might be an additional length attached to the first junction, or additional junctions.

After the multiple network hypotheses have been created, their simulated impulse responses are compared to the estimated network impulse response (giving the error energy). If the error is too large, the intermediate network is discarded. Otherwise, it is retained as a possible network topology.

Note that, because a hypothesized network is constructed and then simulated, trains of multiple impulses in the response caused by repeated reflections between two mismatches are handled properly by the technique. In contrast, an approach which attempts to directly determine the network topology from the impulse response may be overwhelmed by the large numbers of impulses created by multiple reflections.

The iterative process can be summarized as finding the next difference between the simulated and estimated impulse response(s), generating new network topology hypotheses, generating simulated impulse responses, finding the error energy of the responses, and rejecting network hypotheses with large energy, as described above. The iteration process is repeated until a stopping criteria is met.

Various stopping criteria may be used. For example, a maximum number of iterations can be set, after which the iteration is stopped. In this case, there may remain several network topology hypothesis, all of which deviate from the actual topology of the wire network. Such a stopping criteria may be useful, for example, when limited time is available to perform the measurement.

An alternate stopping criteria can be set to stop at the iteration when the error energy for one (or more) of the network topology hypotheses drops below a predefined limit. If one network topology hypothesis remains, it is assumed to be the correct network. If more than one remains, they are all potential candidates. Typically these are symmetrical versions of each other, at which time they are noted to be the same. It is also possible that the difference in their impulse responses is below the measurement accuracy of the device. The error energy may be used to determine the relative probability of each hypothesized network's fit to the actual wire network.

Yet another stopping criteria is that all impulses in the measured impulse response have been considered and accounted for in the wire network model, but the error energy is still large. In this case, it is likely that none of the network topology hypotheses are correct, normally due to errors in the creation of their early stages due to errors in the estimated network impulse response. This can be due to errors from the measurement equipment, or from errors in the calculation of the impulse response (for example, due to excessive overlapping between reflections and/or multiple reflections).

The network topology with the lowest error energy can be output as the mapped network. For all of the above stopping criteria, the error energy can provided an estimate of the reliability of the mapped network.

It will be appreciated that a stopping criterion may be reached after initialization of the wire network model. For example, if the initial wire network model includes only a single hypothesized network topology, and the network topology accounts for all of the peaks in the impulse response, no further iteration is necessary. It is even possible, that no iterations are required. For example, an initial wire network model can be developed from a lookup table having a number of candidate network topologies and corresponding impulse responses. When the impulse response of one of the lookup table entries matches the estimated impulse response, the wire network model can be set equal to the corresponding candidate network topology from the table. Of course, exact matching need not be required. For example, matching within a set error criteria can be accepted. Furthermore, matching may include, for example, accounting for differences due to amplitude scaling, time scaling, and the like. Accordingly, an algorithm for mapping a network can be described in pseudo code as follows:

Obtain a reflectometry response of the network under test
   Estimate the network impulse response from the reflectometry response Initialize a wire network model based on the network impulse response WHILE the impulse response of the wire network model differs
   from the network impulse response
DO
   Adjust the wire network model based on differences between the network impulse response and the impulse response of the wire network model
END-WHILE
Display the wire network model as the result Various details of performing each of these steps in the algorithm will be apparent to one skilled in the art from the discussion herein.

Figure 6:
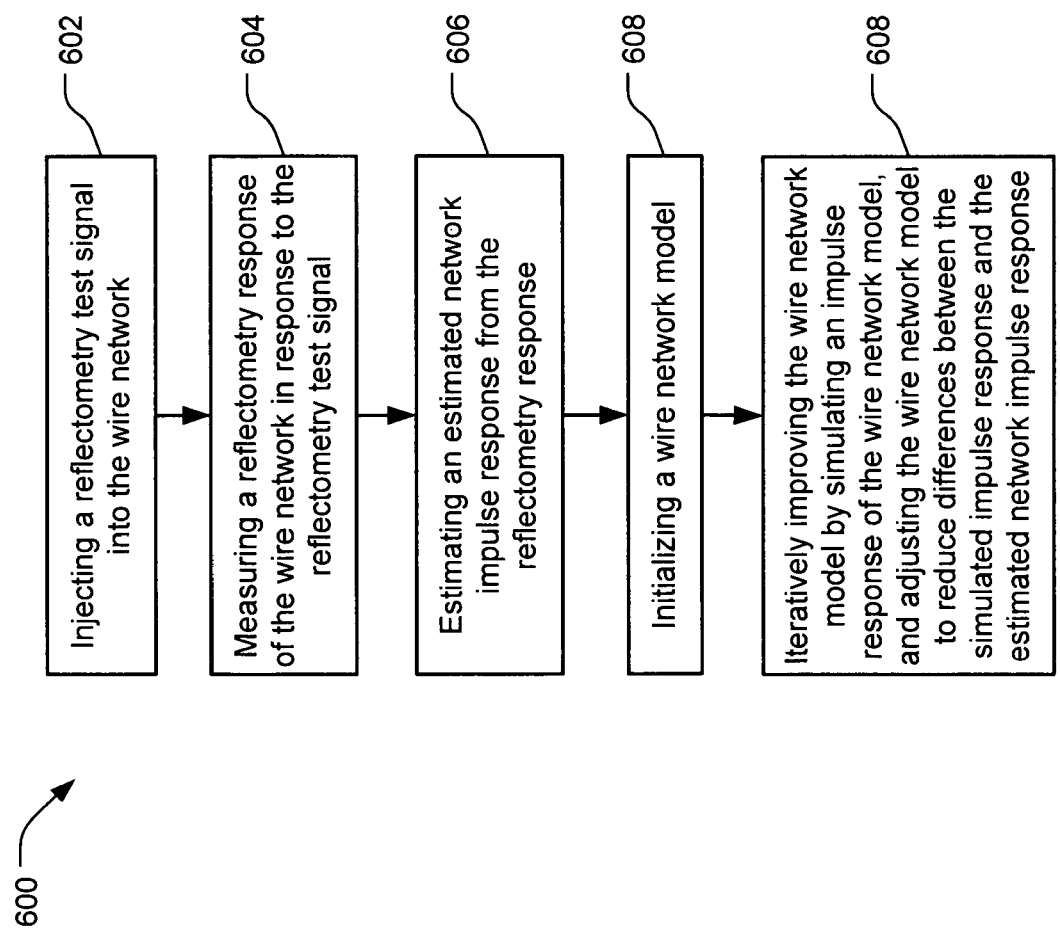
FIG. 6 is a flow chart of a method for mapping a wire network in accordance with an embodiment of the present invention

Finally, a flow chart of a method for mapping a network is illustrated in FIG. 6, in accordance with an embodiment of the present invention. The method 600 may include injecting 602 a reflectometry test signal into the wire network. For example, various ways of injecting a reflectometry test signal into the wire network are discussed above. The method may also include measuring 604 a reflectometry response of the wire network in response to the reflectometry test signal. For example, various reflectometry instruments provide this function as discussed above. The method may also include estimating 606 an estimated network impulse response from the reflectometry response. For example, the network impulse response may be estimated by differentiating or deconvolving the reflectometry response as discussed above. The method may also include iteratively improving 610 the wire network model by simulating an impulse response of the wire network model, and adjusting the wire network model to reduce differences between the simulated impulse response and the estimated network impulse response. For example, as discussed above, various techniques for iteratively improving the wire network, including the use of multiple hypothesized network topologies may be used.

Various alternations and modifications of the method 600 are possible. For example, a number of examples of the method are described below.

By performing the iterative mapping using the impulse responses (that is to say, in the impulse response domain), significant efficiency can be obtained as compared with performing the mapping using the signal response. For example, if the simulation and comparison is done with signal pulses, higher sampling rates may be needed to avoid additional noise being injected by the sampling process. In contrast, by performing the simulation in the impulse response domain, the impulse can be represented by a single sample. The complexity of the simulation process is determined primarily by the number of segments required, which in turn is determined by the number and length of branches of networks to be mapped. Hence, even relatively complex networks can be simulated efficiently.

Figure 8:
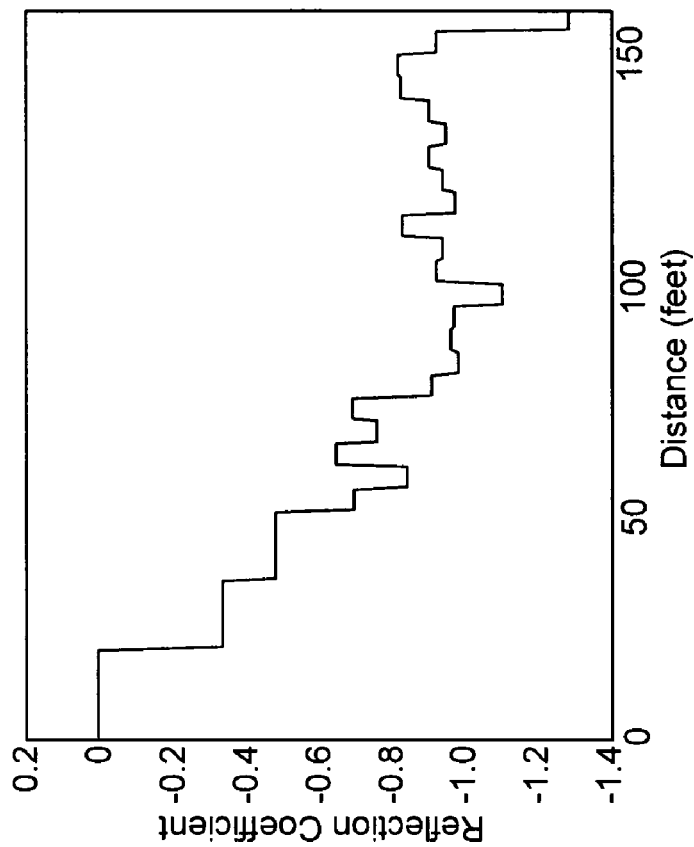
FIG. 8 is a time plot of a simulated TDR reflectometry response of the exemplary network of FIG. 7, in accordance with an embodiment of the present invention.
Figure 7:
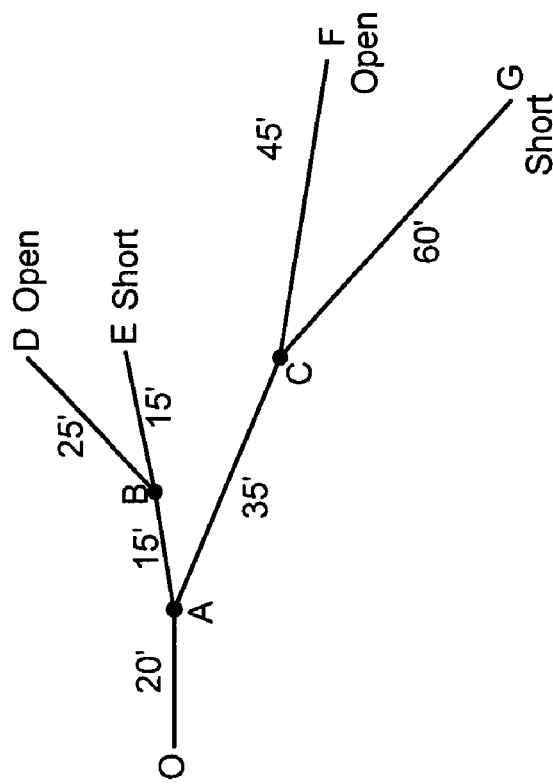
FIG. 7 is a diagram of an exemplary network in accordance with an embodiment of the present invention.
Figure 9:
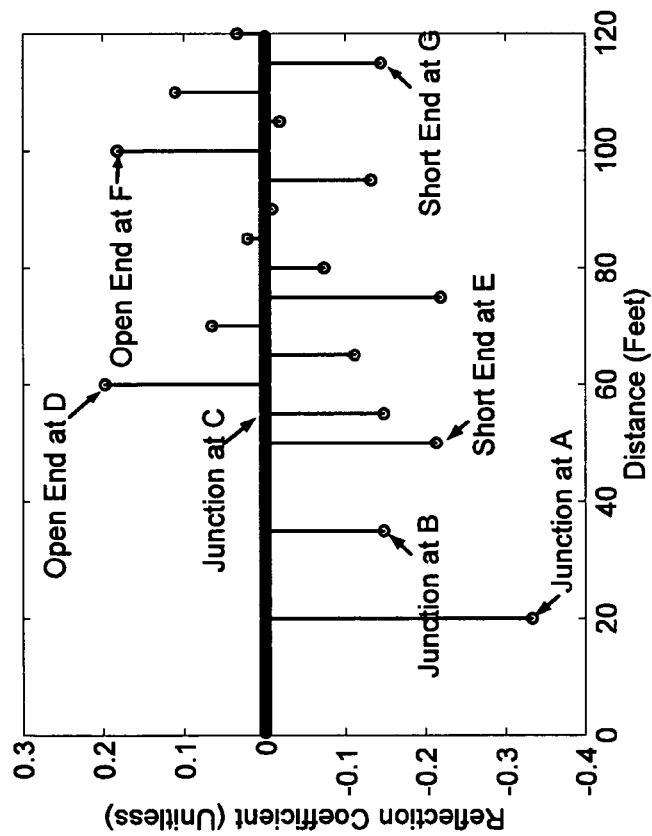
FIG. 9 is a time plot of the impulse response of the exemplary network of FIG. 7, in accordance with an embodiment of the present invention.

A numerical example of operation of the method 600 will now be illustrated using a simulated exemplary network as illustrated in FIG. 7. The exemplary network is tested from the left side at point O, and consists of several branches, joined at junctions A-C, and having ends D-G. The length of each branch is shown in feet. FIG. 8 illustrates a simulated TDR reflectometry response of the network. The resulting impulse response estimated for the network is shown in FIG. 9. It will be appreciated that, for this example, the impulse response can be accurately obtained by differentiating the TDR response, since no noise is present. In low noise testing situations, such a simple algorithm for extracting the impulse response may also prove suitable. In general, however, with the presence of noise, improved results can be obtained by using deconvolution techniques as discussed above.

Impulses attributable to the first reflections from the junctions and ends are labeled in FIG. 9. Additional unlabelled impulses correspond to secondary reflections which result from reflections between junctions and/or ends. For example, the impulse at 65' corresponds to a reflection from junction B, which is re-reflected by junction A back to junction B, re-reflected and then propagated back through junction A to the reflectometer. Note that each junction may create a whole series of impulses, which may also add or subtract from impulses corresponding to single reflections. Note also that the reflections may be attenuated as they pass through each junction.

In the first iteration of the method, the first reflection in the impulse response is analyzed. The first reflection in the impulse response has a magnitude of −0.33 and occurs at a distance of 20'. This indicates the presence of a two way junction (point A) at a distance of 20' into the network. The hypothesized network developed in this iteration thus contains a single wire with a two way junction at a distance of 20'. The impulse response of this hypothesis network can be simulated and compared with the impulse response of the measured network to identify if the hypothesis network matches the network under test, although this is not necessary at this point, since the hypothesis perfectly matches the measured network for the first reflection. If this simulation is performed, and the impulse responses compared, the next point of difference is the second reflection in the impulse response at a distance of 35'.

In the second iteration of the method, the second reflection in the impulse response is analyzed. The second reflection in the impulse response has a magnitude of −0.1481 and occurs at a distance of 35'. This indicates the presence of a 15' branch connected to the 20' wire. The reflection from this point intercepts junction A once during its forward path and once during its backward path. Hence, to determine the reflection coefficient at point B, the transmission effect through junction A is accounted for. Since the reflectometry test signal is attenuated twice by transmission through point A, the actual reflection coefficient at point B if found by dividing the measured impulse of −0.1481 by the transmission coefficient at A squared. The transmission coefficient at A is equal to 0.66, hence the actual reflection coefficient at point B is −0.33, indicating another two way branch.

The hypothesized network at this iteration thus has a 20' cable branched into two cables with one of those cables being a 15' cable with a two way branch at the end. The network can be simulated again, and the impulse responses compared. Note that multiple reflections occurring between point A and B will be generated during the simulation, and thus the hypothesized network also accounts for some of the impulses in the impulse response that are due to the multiple reflections.

In the third iteration of the method, the third reflection in the impulse response is analyzed. The third reflection in the impulse response occurs at 50' and has a reflection of −0.1975.

Figure 10:
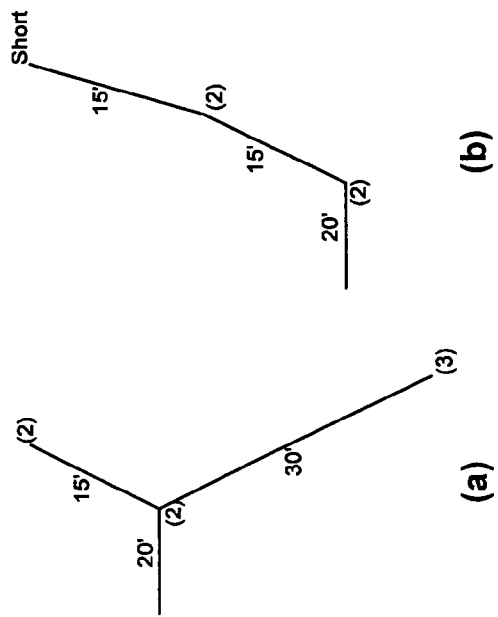
FIGS. 10-13 are diagrams of hypothesis networks developed by a wire network mapping method at various iterations, in accordance with an embodiment of the present invention.

The network is analyzed to determine the possible locations at which a new branch could be inserted into the network. This is done by determining the junctions in the network and the number of branches that need to be filled at each junction. This new branch could be inserted at two possible locations: as a branch of length 30' to the 20' cable at junction A, or as a branch of length 15' to the 15' cable at junction B. The actual reflection coefficient at 30' is determined for each of the hypothesis networks (since compensation for transmission effects may be different for each network) and the resulting networks simulated and compared to the estimated network impulse response. This step helps to eliminate some of the incorrect hypothesis networks. The hypothesis networks developed by the third iteration are shown in FIGS. 10(a) and 10(b). The numbers next to each segment are the hypothesized length of the segments, and the numbers in parentheses at the junctions are the hypothesized number of branches from the junction.

Figure 11:
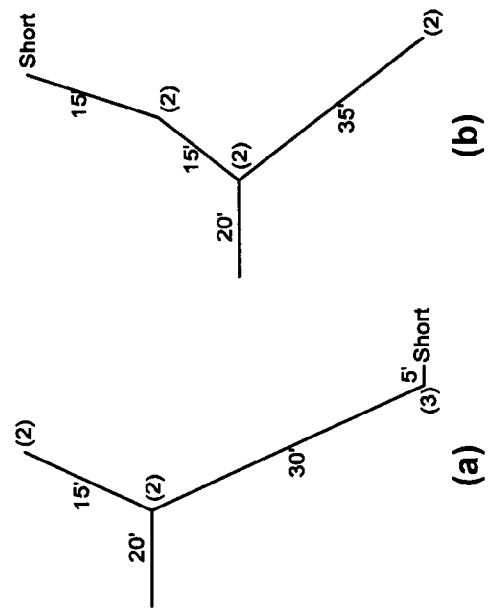

In the fourth iteration of the method, each of the hypothesis networks is analyzed to insert a new cable that corresponds to the fourth reflection in the impulse response. The fourth reflection occurs at a distance of 55' and has a reflection value of −0.1481. This new branch can be inserted in two possible locations in the first hypothesis network of FIG. 10(a) and in three possible locations in the second hypothesis network of FIG. 10(b). The transmission reflection effects due to the new branch are analyzed, and the possible locations for new branches are determined for both the networks. This branch is inserted into the hypothesis network topologies and the developed networks are simulated individually to check if their impulse responses are close to the impulse response of the network under test. Out of the five possible intermediate networks, only two intermediate networks are found to have impulse responses close to that of the network under test. The other three hypothesis networks are eliminated from further analysis. The hypothesis networks developed during this iteration are shown in FIGS. 11(a) and 11(b)

In the fifth iteration of the method, the fifth reflection in the impulse response is analyzed. This reflection occurs at a distance of 60' and has a reflection value of 0.1975. This branch is inserted in the different possible locations of the hypothesis networks to create new hypotheses, and is analyzed in the same way as in the previous iterations. At the completion of the fifth iteration, the impulse response has been matched not only for the reflections from junctions A-E, but secondary reflections between these junctions and/or the end have also been accounted for. Hence, the next point of difference is at a distance of 100'.

Figure 12:
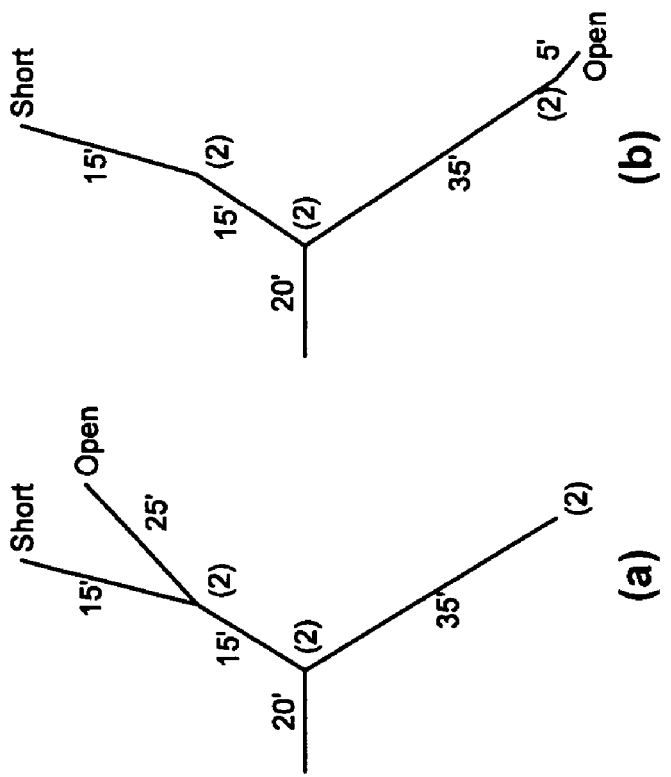

In the sixth iteration, the sixth reflection is analyzed. This reflection occurs at a distance of 100, and has a reflection value of 0.1975. This reflection is analyzed and hypothesis network structures are developed in the same manner as in the previous iterations. The developed hypothesis networks after the sixth iteration are shown in FIGS. 12(a) and 12(b).

Figure 13:
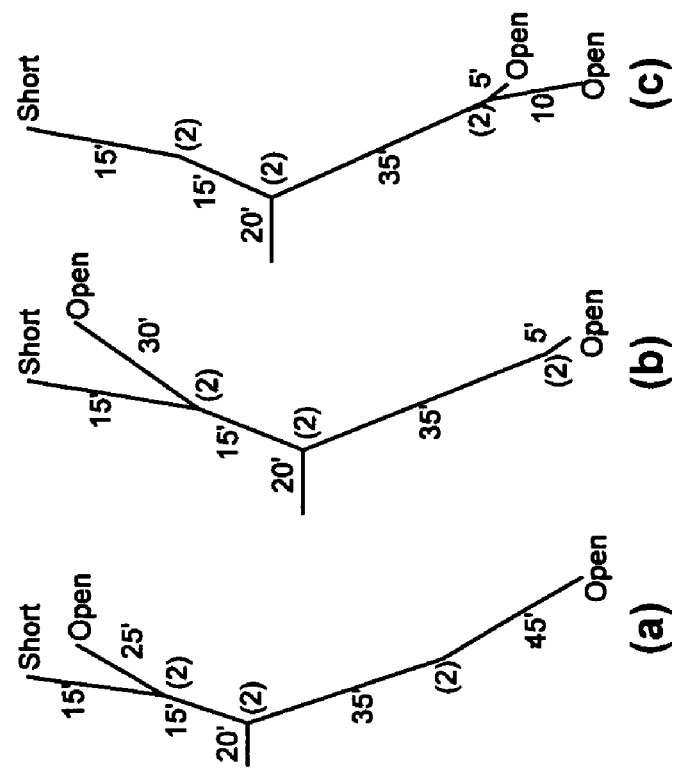

In the seventh iteration of the method, the last primary reflection in the network is analyzed. This reflection has a reflection value of −0.1975 and occurs at a distance of 115'. The new branch can be inserted as a 60' branch for the 35' cables in the first and second hypothesis networks, or as an 80' branch for the 15' cable in the third hypothesis network. Each of these networks, shown in FIGS. 13(a)-13(c), is analyzed to determine the number of branches of the new cable. The impulse response of each of the hypothesis networks is then simulated and compared with that of the network under test. At this iteration, the network developed from the first hypothesis network of FIG. 13(a) is found to exactly match the impulse response of the network under test. This network structure is identified as the network structure under test, and can be displayed to a user.

Although the example just illustrated is for a noise-free environment, the method can also map networks in a noisy environment of an actual network. In general, the performance of the method depends on the environment. Some reflections can be very small, or located very close in time. For example, small impedance changes, e.g. due to a fray or chafe in a wire, may result in only very small reflections, which are difficult or even impossible to identify. As another example, very short stubs result in closely spaced in time reflections that can be difficult to resolve. As the length and complexity of a network increases, reflections from remote portions of the network are attenuated as they are reflected back through junctions, aggravating this difficulty. Furthermore, noise, measurement errors, and the like, are generally present in electrical systems, which cause further deviations from ideal operation.

Noise can be reduced with well known techniques such as filtering and averaging as is known in the art. A particular benefit of the method, however, is that a reflectometer type can be chosen that is less sensitive to errors present in the particular environment. For example, SSTDR can provide benefits in rejection of noise or interfering signals which can provide improved network mapping accuracy in a noisy environment. As noted above, additional improvement can also be obtained in mapping the network by using reflectometry responses obtained from more than one location in the network, providing further robustness in the presence of noise.

Because the network mapping technique can be automated, this provides a significant improvement over manual, labor intensive analysis of reflectometry results. Automated network mapping can also prove helpful in including integrated test function within an electronic system, improving the self-testing capability of the system. For example, when combined with reflectometers such as the SSTDR or NDR, which are compatible with operational signals, the mapping technique can be embedded within a system as a form of built in test.

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiment(s) of the invention, it will be apparent to those of ordinary skill in the art that numerous modifications can be made without departing from the principles and concepts of the invention as set forth herein. Accordingly, it is not intended that the invention be limited, except as by the claims set forth below.

What is claimed is:

1. A method of mapping a wire network having branches, comprising:
   obtaining a reflectometry response of the wire network;
   estimating an estimated network impulse response from the reflectometry response;
   initializing a wire network model having hypothesized branches;
   iteratively improving the wire network model by
      simulating an impulse response of the wire network model, and
      adjusting the wire network model to reduce differences between the simulated impulse response and the estimated network impulse response.

2. The method of claim 1, wherein obtaining a reflectometry response of the wire network comprises:
   injecting a reflectometry test signal into the wire network; and
   measuring a reflectometry response of the wire network in response to the reflectometry test signal.

3. The method of claim 2 wherein injecting a reflectometry test signal into the wire network comprises injecting a test signal chosen from the set consisting of a fast rise time pulse, a pseudorandom sequence, a spread spectrum signal, a swept-frequency sine wave, and a stepped-frequency sine wave.

4. The method of claim 2 wherein measuring a reflectometry response of the wire network comprises observing reflections of the reflectometry test signal generated by mismatches in the wire network.

5. The method of claim 2 wherein injecting a reflectometry test signal comprises injecting the reflectometry test signal at a first point in the wire network.

6. The method of claim 5 wherein measuring a reflectometry response of the wire network comprises observing a signal response of the wire network at the first point.

7. The method of claim 5 wherein measuring a reflectometry response of the wire network comprises observing a signal response of the wire network at a second point.

8. The method of claim 1 wherein obtaining a reflectometry response comprises observing a time domain response of the wire network to an injected reflectometry test signal.

9. The method of claim 1 wherein estimating an estimated network impulse response from the reflectometry response comprises differentiating the reflectometry response.

10. The method of claim 1 wherein estimating an estimated network impulse response from the reflectometry response comprises deconvolving the reflectometry response.

11. The method of claim 1, wherein initializing a wire network model comprises defining the wire network model as a plurality of hypothesized network topologies.

12. The method of claim 1, wherein initializing a wire network model comprises including known portions of the network topology within the wire network model.

13. The method of claim 11, wherein iteratively improving the wire network model comprises:
   creating a plurality of simulated impulse responses for the plurality of hypothesized network topologies;
   comparing each of the plurality of simulated impulse responses to the estimated network impulse response; and discarding those network topologies for which the difference between the simulated impulse response and the network impulse response exceeds a predetermined limit.

14. The method of claim 1, wherein iteratively improving a network model comprises:
generating a plurality of hypothesized network topologies;
creating a plurality of simulated impulse responses corresponding to the plurality of hypothesized network topologies;
comparing each of the plurality of simulated impulse responses to the estimated network impulse response; and
adjusting the wire network model to correspond to the hypothesized network topology which most closely matches the estimated network impulse response.

15. The method of claim 14 wherein generating a plurality of hypothesized network topologies comprises hypothesizing a network feature at a location corresponding to a first difference between the estimated network impulse response and one the plurality of simulated impulse responses.

16. The method of claim 15 wherein hypothesizing a network feature comprises selecting a network feature from the group consisting of an open circuit, a short circuit, an impedance change, and a branch.

17. The method of claim 15 wherein generating a plurality of hypothesized network topologies comprises modifying at least one of the plurality of hypothesized network topologies to include the network feature.

18. The method of claim 15 wherein generating a plurality of hypothesized network topologies comprises creating new hypothesized network topologies from one of the plurality of hypothesized network topologies, each new hypothesized network topology having a different network feature at a location corresponding to a first difference between the estimated network impulse response and the one of the plurality of hypothesized network topologies.

19. The method of claim 14 wherein creating a plurality of simulated impulse responses comprises:
defining a plurality of equal length segments of the hypothesized network topology;
defining a state vector wherein each element of the state vector corresponds to the signal state on a unique segment of the hypothesized network topology;
forming a state transition matrix wherein each element of the state transition matrix corresponds to the signal flow between a pair of segments of the hypothesized network topology; and
generating the simulated impulse response using the state vector and the state transition matrix.

20. The method of claim 19 wherein generating the simulated impulse response comprises:
initializing the state vector;
repeatedly multiplying the state vector by the state transition matrix; and
extracting the simulated impulse response from the state vector.

21. The method of claim 19 wherein the state vector has two elements for each segment of the hypothesized network topology, wherein one element corresponds to a forward flowing signal on the segment and one element corresponds to a reverse flowing signal on the segment.

22. The method of claim 14, wherein comparing each of the plurality of simulated impulse responses comprises determining an error between the simulated impulse response and the estimated network impulse response at an earliest point in time where the simulated impulse response differs from the estimated network impulse response.

23. The method of claim 14, wherein comparing each of the plurality of simulated impulse responses comprises determining an error between the simulated impulse response and estimated network impulse response at a plurality of points in time.

24. The method of claim 23, wherein determining the error comprises weighting the error at earlier points in time more heavily than the error at later points in time.

25. The method of claim 14, wherein adjusting the wire network model comprises selecting the one of the plurality of hypothesized network topologies for which the corresponding simulated impulse response most closely matches the estimated network impulse response and discarding the other ones of the plurality of hypothesized network topologies.

26. The method of claim 14, wherein adjusting the wire network model comprises maintaining a subset of the plurality of hypothesized network topologies for which the corresponding simulated impulse response approximately match the estimated network impulse response and discarding the other ones of the plurality of hypothesized network topologies.

27. A method of mapping a wire network having branches, comprising:
injecting a reflectometry test signal into the wire network;
measuring a reflectometry response of the wire network in response to the reflectometry test signal;
estimating an estimated network impulse response from the reflectometry response;
initializing a wire network model having hypothesized branches based on the estimated network impulse response; and
adjusting the wire network model if differences between an impulse response of the wire network model and the estimated network impulse response are present.

28. The method of claim 27, wherein initializing a wire network model comprises selecting a candidate network topology having a most closely matching corresponding impulse response, wherein the candidate network topology is selected from a table having a plurality of candidate network topologies and corresponding impulse responses.

29. The method of claim 27 wherein adjusting the wire network model comprises:
simulating an impulse response of the wire network model, and
adjusting the wire network model to reduce differences between the simulated impulse response and the estimated network impulse response.

30. A method of mapping a wire network, comprising:
obtaining a plurality of reflectometry responses of the wire network at a plurality of differing test points within the network;
estimating a plurality of estimated network impulse response from the corresponding plurality of reflectometry responses;
initializing a wire network model having hypothesized branches;
iteratively improving the wire network model by
simulating a plurality of impulse responses of the wire network model corresponding to each test point within the network, and
adjusting the wire network model to reduce differences between the plurality of simulated impulse responses and the estimated network impulse response.

31. The method of claim 30, wherein obtaining a reflectometry response of the wire network comprises:
   injecting a reflectometry test signal into the wire network at a first test point; and
   measuring the plurality of reflectometry responses of the wire network in response to the reflectometry test signal at a corresponding plurality of second test points.

32. The method of claim 30, wherein obtaining a reflectometry response of the wire network comprises:
   injecting a reflectometry test signal into the wire network at a plurality of first test points; and
   measuring the plurality of reflectometry responses of the wire network in response to the reflectometry test signal at an at least one second test point.

33. The method of claim 30, wherein adjusting the wire network model comprises:
   generating a plurality of hypothesis network models which correspond to an initial portion of at least a first one of the plurality of estimated network impulse responses; and
   eliminating hypothesis network models which do not correspond to an initial portion of at least one second one of the plurality estimated network impulse responses different from the first one of the plurality of estimated network impulse responses.

34. A computer program product, the computer program product comprising:
   a computer usable medium having computer readable program code embodied therein for mapping a wire network having branches, the computer readable program code comprising:
   computer readable program code configured to obtain a reflectometry response of the wire network;
   computer readable program code configured to estimate an estimated network impulse response from the reflectometry response;
   computer readable program code configured to initialize a wire network model having hypothesized branches; and
   computer readable program code configured to iteratively improve the wire network model by simulating an impulse response of the wire network model and adjusting the wire network model to reduce differences between the simulated impulse response and the estimated network impulse response.

35. An apparatus for mapping a wire network having branches, comprising:
   a reflectometry instrument configured to obtain a reflectometry response of the wire network;
   an impulse response extractor coupled to the reflectometry instrument and configured to estimate an estimated network impulse response from the reflectometry response;
   a network simulator configured to simulate the impulse response from a hypothesized network having hypothesized branches to form a simulated impulse response; and
   a mapper coupled to the impulse response extractor and coupled to the network simulator and configured to compare the simulated impulse response to the estimated network impulse response and revise the hypothesized network to reduce differences between the simulated impulse response and estimated network impulse response.

36. The apparatus of claim 35 wherein the reflectometry instrument is chosen from the group of reflectometry instruments consisting of a TDR, a FDR, a SWR, a STDR, a SSTDR, a MSR, and a NDR.

37. The apparatus of claim 35 wherein the impulse response extractor comprises a deconvolver.

* * * * *